United States Patent [19]

Dorlanne

[11] Patent Number: 4,933,811

[45] Date of Patent: Jun. 12, 1990

[54] DIRECT-TRANSFER ELECTRICAL COMPONENT

[75] Inventor: Olivier Dorlanne, Dijon, France

[73] Assignee: Compagnie Europeenne de Composants Electroniques LCC, Courbevoie, France

[21] Appl. No.: 450,939

[22] Filed: Dec. 15, 1989

[30] Foreign Application Priority Data

Dec. 20, 1988 [FR] France .................. 88 16810

[51] Int. Cl.⁵ .................. H01G 9/00; H05K 1/16
[52] U.S. Cl. .................. 361/405; 361/540
[58] Field of Search ........... 361/306, 308, 309, 310, 361/538, 539, 540, 405, 417; 29/25.42

[56] References Cited

U.S. PATENT DOCUMENTS

| 3,550,228 | 12/1970 | Asscher | 29/25.42 |
| 4,288,842 | 9/1981 | Voyles | 361/540 |
| 4,617,609 | 10/1986 | Utner et al. | 29/25.42 X |
| 4,675,790 | 6/1987 | De Matos et al. | 361/540 |

FOREIGN PATENT DOCUMENTS

A162149 11/1985 European Pat. Off. .
A171838 2/1986 European Pat. Off. .

*Primary Examiner*—Donald A. Griffin
*Attorney, Agent, or Firm*—Pollock, Vande ande & Priddy

[57] ABSTRACT

The electrical component of the invention is such that, being of parallelepipedic form, each of at least two of its mutually opposite lateral faces is equipped with an element of each of the two connecting electrodes of the component.

5 Claims, 1 Drawing Sheet

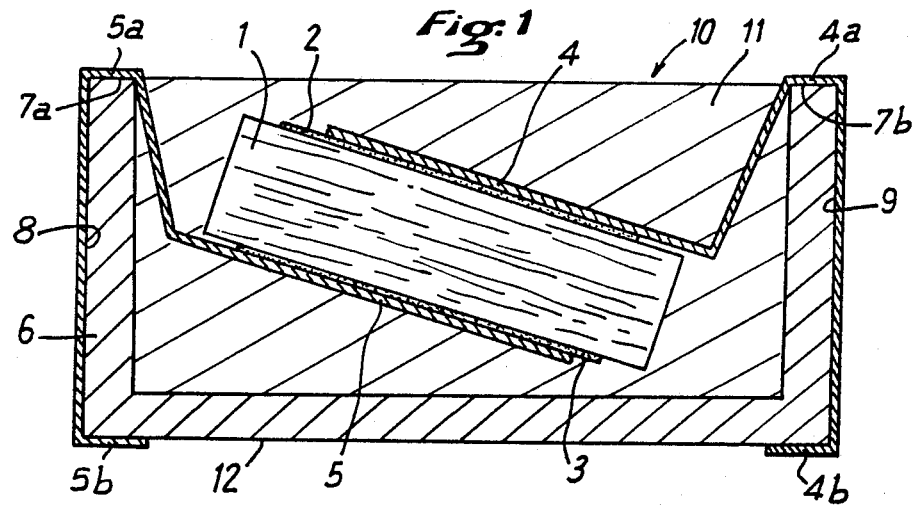

DIRECT-TRANSFER ELECTRICAL COMPONENT

BACKGROUND OF THE INVENTION

1. Field of the Invention

The present invention relates to an electrical (or electronic) component with direct transfer on to a printed circuit, in contrast to transfer by plugging-in.

2. Description of the Prior Art

It is increasingly preferable, in the electronic sector, to use surface-mounting components which have many advantages over plug-in components. Mention will be made, as a reminder, of greater miniaturization, higher reliability, a weight saving, an improvement in the signal transit speed, better resistance to vibrations, etc. Furthermore, they afford greater ease of assembly by means of automatic production lines.

This type of component can be passive or active. It can be a capacitive element or a varistor, the latter being used in the sector of protection against electrical overvoltages.

There are two known types of component of this type in "chip" form, according to whether they are protected by a simple protective layer (as in European document No. 229,286) or whether they are embedded in a protective resin, as with the devices according to Japanese documents JP No. 86,219,440 or JP No. 86,235,478.

The devices of the first type have connecting electrodes for the component which are symmetrical in relation to a longitudinal mid-plane of the component. In other words, each of the mutually opposite parallel faces by means of which the chip can be connected to the printed circuit each possesses two electrodes. This geometrical arrangement makes it possible to do without an orientating operation to offer the component to the printed circuit, this being advantageous where an automatic feed is concerned. Their main disadvantages are that they have scarcely no resistance in a hot and humid atmosphere because of too great a difference in the coefficients of expansion of the various elements of the component (ceramic, glass, metal) and a fixing-together of these elements by contact and pressing.

Where the devices of the second type are concerned, there is a satisfactory resistance to an aggressive atmosphere, but the electrodes have no symmetry, with the result that the component has to be oriented before it is mounted on the printed circuit.

The present invention is intended to combine the advantages of the two types of component mentioned above by eliminating their disadvantages.

SUMMARY OF THE INVENTION

To achieve this, therefore, the subject of the invention is an electrical component with direct surface transfer, embedded in a parallelepipedic protective coating mass, some outer surfaces of which carry plane connecting electrodes and in which each of at least two mutually opposite parallel surfaces of the parallelepiped is equipped with an element of each of the two connecting electrodes of the component.

In a first embodiment, this component comprises an active or passive element which has two electrical terminations, to which the electrodes are connected, and which is seated in a parallelepipedic housing open on one of its faces, the electrodes being composed of strips shaped as suspension hooks for the element and each covering one of the mutually opposite edges of the orifice of the housing, the strips being extended along the housing faces terminating in the abovementioned edges and, at the other end of these faces, having a return directed under the housing in parallel with that part of the strip bearing on the abovementioned edges.

This housing is preferably filled with polymerized resin. In an alternative version, it is closed by means of a cover made of the same material as the housing, thus giving the component the same visual appearance, from whatever direction it is viewed.

In another embodiment, the strip forming each electrode is obtained from the coating mass via the for one of the electrodes and the middle part of the opposite face for the other electrode, this strip being slit to form tabs bent against the face from which it is obtained on either side of its plane, each tab having a return on to that face of the parallelepiped contiguous with this end face.

BRIEF DESCRIPTION OF THE DRAWINGS

The invention will be understood better from the following description of two embodiments given purely as an indication and in a non-limiting way.

Reference will be made to the accompanying drawings in which:

FIG. 1 is a sectional view of a first embodiment of the invention,

FIG. 2 is a section through an alternative embodiment of FIG. 1,

FIG. 3 is a diagram of a second embodiment of a component according to the invention after the active or passive element has been molded over in the resin, FIG. 4 shows the component of FIG. 3 in its final configuration.

DESCRIPTION OF THE PREFERRED EMBODIMENTS

These Figures show at 1 a varistor made of ceramic (zinc oxide to which a certain number of additive oxides is added according to a technique known to an average person skilled in the art). This ceramic takes the form of a disk or a parallelepiped, and two mutually opposite faces of this element are metallized. The metallic layer 2, 3 can be a silver paste deposited by screen printing. A metal strip 4, 5 is fastened by any known means to the metallic layers 2, 3. This strip can be a portion of a connecting band, such as it was possible to describe in French document No. 2,581,827. In the process for producing the component according to the invention, the ceramic 2 equipped with its strips 4, 5 is placed in a housing 6, in such a way that each strip 4, 5 bears on the upper edge 7a, 7b of two mutually opposite faces 8 and 9 of the housing 6, these edges limiting the housing orifice 10, via which the element 1 is introduced into the housing. The inclination of the ceramic 1, as illustrated in FIG. 1, in the housing makes it possible to have two strips 4 and 5 of identical length. The figure shows that, by means of a press, the strips 4 and 5 can be shaped into the form of hooks bearing on the edges 7a 7b of the walls 8 and 9. The housing is subsequently filled with resin 11 resistant to wave welding either under a vacuum or in air, depending on the particular resin, so as to embed the ceramic 1 in the housing 6, and this resin is polymerized by undergoing a suitable thermal cycle. The strips 4 and 5 are thereafter bent so as to extend along the faces 8 and 9 of the housing and have a return under the bottom 12 of the latter. The component, thus finished, possesses two identical electrodes 5a, 4a or 5b, 4b on each of the two mutually opposite parallel faces. Mounting this component by surface transfer can be carried out equally via either one of these faces.

The usefulness of the arrangement of FIG. 1 is that the strips 4 and 5 (which form a connecting band) are of equal length.

The arrangement of FIG. 2 shows a ceramic 1, of which the connecting tabs 14 and 15 are obtained from the same side. This can be advantageous in terms of the placing of the ceramic between the tabs 14 and 15, especially for the welding operation. It is then seen that the conductive strip 14 is bent so as to surround the wall 9 of the housing 6, whilst the conductive strip 15 forms a return, extending internally along the bottom 12 and subsequently surrounding the wall 8. As in the preceding instance, the inner volume of the housing 6 is filled with polymerized resin. Furthermore, a cover 13 is fitted by being introduced forcibly or wedged in the orifice of the housing, so as to give the latter the same visual appearance, from whatever direction it is viewed. As in respect of the preceding figure, each of the two parallel faces of the component has two connecting electrodes 15a, 14a and 15b, 14b.

FIGS. 3 and 4 illustrate another embodiment of the component according to the invention. The connecting band, which serves for producing the electrodes by ensuring, during overmolding, electrical continuity between the outside and the metallized faces of the active or passive element and which performs the function of supporting and driving all the components during their production, is welded to these silvered faces by any known process. The connecting band is generally made of tin-plated brass with a copper undercoating. It can also be made of tin-plated ferronickel or cupronickel.

The connecting band is then placed in a press which makes it possible, by means of a suitable form of the mold, to mold over the ceramic with a filled epoxy resin 20 by transfer or with a phenylene polysulfide by injection. In this case, the connecting band advantageously serves as a joint face during overmolding.

The strips, subsequently bent to form the electrodes, are formed by the portions of connecting band which, cut-out and separated from the rest of the band, project from the overmolding. In FIG. 3, they take the form of three parallel tabs projecting from the component via the middle part of two mutually opposite end faces 21, 22 The tabs 23a, 23b, 23c form one electrode, whilst the others 24 form another electrode. The component illustrated in FIG. 4 is produced by folding and it too has two electrodes 23, 24. In this embodiment, as in the preceding embodiment, reserves for accommodating the bent tabs forming electrodes can be provided during the molding of the resin.

The components can be marked by stamping or by laser recording. Their main advantage is that they can be supplied in bulk and be placed in installations for automatic delivery to a circuit production line, particularly comprising vibratory bole feeders.

I claim:

1. An electrical component with direct surface transfer, comprising an active or passive element having two electrical terminations, this element being embedded in a parallelepipedic protective coating mass, the component also possessing plane connecting electrodes connected electrically to the terminations, the electrodes being mainly arranged on two mutually opposite faces of said mass and each being extended by parts turned down on to two other adjacent faces, these two other faces being parallel to one another, the component having a parallelepipedic housing, in which said element is placed and which contains a protective coating, the electrodes being composed of strips shaped as suspension hooks for said element, each strip having one end connected electrically to one of the terminations and its other end projecting from the housing so as to be bent on to one of its outer faces and also on to its bottom.

2. An electrical component as claimed in claim 1, wherein said element is arranged in the housing obliquely relative to the bottom of the housing, the strips thus being of equal length.

3. An electrical component as claimed in claim 1, wherein the inner volume of the housing is at least partially filled with polymerized resin.

4. An electrical component as claimed in any one of claims 1 to 3, wherein the housing has a cover for closing its open face.

5. An electrical component with direct surface transfer, comprising an active or passive element having two electrical terminations, this element being embedded in a parallelepipedic protective coating mass, the component also possessing plane connecting electrodes connected electrically to the terminations, the electrodes being mainly arranged on two mutually opposite faces of the said mass and each being extended by parts turned down on to two other adjacent faces, these two other faces being parallel to one another, wherein, the electrodes being composed of strips, these are obtained from the coating mass via the middle part of said mutually opposite faces, each strip being slit to form tabs bent against the face from which it is obtained on either side of its plane, each tab having a return on to that face of the parallelepipedic mass adjacent to the face from which it is obtained.

* * * * *